US010326252B2

(12) United States Patent
Bohn

(10) Patent No.: US 10,326,252 B2
(45) Date of Patent: Jun. 18, 2019

(54) BEAM PROJECTION FOR FAST AXIS EXPANSION

(71) Applicant: Microsoft Technology Licensing, LLC, Redmond, WA (US)

(72) Inventor: David Bohn, Fort Collins, CO (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 201 days.

(21) Appl. No.: 14/705,327

(22) Filed: May 6, 2015

(65) Prior Publication Data

US 2016/0329679 A1 Nov. 10, 2016

(51) Int. Cl.
*H01S 5/00* (2006.01)
*H01S 5/022* (2006.01)
*G02B 27/09* (2006.01)
*G02B 5/02* (2006.01)
*G02B 5/06* (2006.01)

(52) U.S. Cl.
CPC .......... *H01S 5/0071* (2013.01); *G02B 5/0278* (2013.01); *G02B 5/0294* (2013.01); *G02B 5/06* (2013.01); *G02B 27/095* (2013.01); *H01S 5/02244* (2013.01); *H01S 5/02248* (2013.01); *H01S 5/02268* (2013.01); *H01S 5/02272* (2013.01); *H01S 5/02276* (2013.01)

(58) Field of Classification Search
CPC ............... H01S 5/0071; H01S 5/02244; H01S 5/02268; G02B 5/0278; G02B 5/0294; G02B 5/06; G02B 27/095; G02B 5/02
USPC ............................................... 359/209.1, 599
See application file for complete search history.

(56) References Cited

U.S. PATENT DOCUMENTS 6,921,215 B2 7/2005 Catchmark et al.
6,975,465 B1 12/2005 Chung et al.
(Continued)

FOREIGN PATENT DOCUMENTS

EP 1708009 A2 * 10/2006 ......... G02B 27/0905
EP 2363686 A1 9/2011

OTHER PUBLICATIONS

Roff, et al., "Laser Diodes: High-Power Laser Diode Modules Pump Disk Lasers", Published on: Dec. 13, 2013 Available at: http://www.laserfocusworld.com/articles/print/volume-49/issue-12/features/laser-diodes-high-power-laser-diode-modules-pump-disk-lasers.html.
(Continued)

*Primary Examiner* — Robert E. Tallman
(74) *Attorney, Agent, or Firm* — Holzer Patel Drennan

(57) ABSTRACT

A light projection system disclosed herein provides fast axis expansion of a light beam for high optical performance despite sizing constraints of a device into which the light projection system is integrated. In one implementation, the light projection system includes a diffuser, an edge-emitting semiconductor laser diode, and a printed circuit board. The diffuser defines a diffuser plane and is oriented to be substantially parallel to least a portion of the printed circuit board. The edge-emitting semiconductor laser diode emits laser light having a fast axis and a slow axis, with the fast axis of the laser light defining a fast axis plane corresponding to a path the laser light travels from the edge-emitting semiconductor laser diode. The edge-emitting semiconductor laser diode is oriented such that the fast axis plane is substantially parallel the diffuser plane between the diffuser and at least the parallel portion of the printed circuit board.

20 Claims, 9 Drawing Sheets

(56) References Cited

U.S. PATENT DOCUMENTS

| | | | |
|---|---|---|---|
| 7,275,252 B2 | 9/2007 | Volk et al. | |
| 7,697,207 B2 | 4/2010 | Govorkov et al. | |
| 7,763,478 B2* | 7/2010 | Loh | B29C 45/14655 |
| | | | 257/E31.123 |
| 8,113,724 B2 | 2/2012 | Terada et al. | |
| 8,329,482 B2 | 12/2012 | Yao et al. | |
| 8,570,657 B2 | 10/2013 | McBride et al. | |
| RE44,829 E | 4/2014 | DeDobbelaere et al. | |
| 8,773,644 B2 | 7/2014 | Suzuki et al. | |
| 8,842,705 B2 | 9/2014 | Janssens et al. | |
| 2007/0195276 A1* | 8/2007 | Plut | H04N 9/3141 |
| | | | 353/31 |
| 2008/0055550 A1* | 3/2008 | Kim | G03B 21/16 |
| | | | 353/20 |
| 2012/0224151 A1* | 9/2012 | Dassanayake | G02B 5/021 |
| | | | 353/33 |
| 2012/0253331 A1 | 10/2012 | Liu et al. | |
| 2013/0258469 A1 | 10/2013 | Park et al. | |
| 2014/0340931 A1* | 11/2014 | Nishitani | G02B 6/0028 |
| | | | 362/609 |
| 2015/0103404 A1 | 4/2015 | Rudy et al. | |

OTHER PUBLICATIONS

"Design of High-Brightness, Fiber-Coupled Diode Laser Modules", Published on: Jan. 1, 2015 Available at: http://www.techbriefs.com/component/content/article/23-ntb/features/feature-articles/21283-design-of-high-brightness-fiber-coupled-diode-laser-modules?limitstart=0.

Pitwon, et al., "FirstLight: Pluggable Optical Interconnect Technologies for Polymeric Electro-Optical Printed Circuit Boards in Data Centers", In Journal of Lightwave Technology, vol. 30, No. 21, Nov. 1, 2012, pp. 3316-3329.

Applied Thin-Film Products: Vias: Au or CU Solid Filled, retrieved Apr. 20, 2015, http://www.thinfilm.com/vias-solid.html, 2 pages.

"International Preliminary Report on Patentability Issued in PCT Application No. PCT/US2016/026305", dated Jul. 17, 2017, 7 Pages.

"Second Written Opinion Issued in PCT Application No. PCT/US2016/026305", dated Mar. 16, 2017, 4 Pages.

"International Search Report & Written Opinion Issued in PCT Application No. PCT/US2016/026305", dated Jun. 20, 2016, 11 Pages.

"Office Action Issued in European Patent Application No. 16717755.9", dated Jan. 29, 2019, 4 Pages.

* cited by examiner

BEAM PROJECTION FOR FAST AXIS EXPANSION

BACKGROUND

Light projection systems can be integrated into electronic devices for use in a variety of different applications. In some applications, time of flight (TOF) measurements of projected light (e.g., laser light) are used to provide depth information about a surrounding environment. In other applications, structured light patterns are projected and distortions of such patterns are measured to extract positioning and depth information regarding various objects reflecting the structured light. In still other applications, projected laser light is used for biometric assessments such as eye tracking, retina identification, facial recognition, etc.

Consumer demand for smaller and thinner electronics such as phones, watches, tablets, etc., constrains available design choices, presenting a number of challenges to incorporating light projection systems into mobile electronic devices.

SUMMARY

According to one implementation, the disclosed technology provides for a light projection system including an edge-emitting semiconductor laser diode, a diffuser, and a printed circuit board. The diffuser defines a diffuser plane and is oriented to be substantially parallel to at least a portion of the printed circuit board. The edge-emitting semiconductor laser diode emits laser light having a fast axis and a slow axis, with the fast axis of the laser light defining a fast axis plane corresponding to a path the laser light travels away from the edge-emitting semiconductor laser diode. The edge-emitting semiconductor laser diode is affixed to a submount and oriented such that the fast axis plane of the laser light is substantially parallel with the diffuser plane between the diffuser and at least the parallel portion of the printed circuit board.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

DETAILED DESCRIPTIONS

Despite a large number of applications for light projection optics in mobile electronic devices, effective integration of such optics into various mobile electronic devices presents design challenges due, in part, to a compact size of many electronics, particularly in device thickness. In some applications, light is passed through a diffuser that redistributes and projects incident light. The diameter size of a light beam incident on the diffuser (the "spot size") directly affects the uniformity and brightness of illumination of the projected light in the far field. Consequently, this 'spot size' directly affects the efficacy of various tools utilizing the projected light. In addition, some jurisdictions impose regulations specifying a minimum spot size for device safety.

The spot size of a light beam incident on a diffuser depends, in part, on the optical path that the light beam travels between a light source and the diffuser. A longer optical path length may permit the light beam to sufficiently expand to a desired minimum spot size before the beam contacts the diffuser. In addition, light beam spot size may also depend, in part, on a degree by which the light beam is permitted to expand prior to reaching the diffusing device. Some light beams do not expand uniformly along an optical path. If the light beam is oriented such that a fast axis of expansion aligns with a thin axis of the electronic device, expansion is effectively limited by the available travel distance within a casing of the electronic device. As used herein, a "thin axis" refers to an axis defining a thinnest dimension (e.g., length) of an electronic device. For example, a cell phone has a thin axis perpendicular to a display screen, which may impose a hard spatial limit on beam expansion in the thin axis direction.

The herein disclosed technology provides a number of light projection systems that facilitate substantially uniform far field illumination of projected light by providing for fast axis beam expansion and/or improved optical path length. "Substantially uniform far field illumination" refers to, for example, a sufficient uniformity in the far field such that the variation in the far field intensity provides for a resolution that offers useful optical analysis of far field data. In the discussion, unless otherwise stated, adjectives such as "substantially" and "about" modifying a condition or relationship characteristic of a feature or features of an embodiment of the disclosure, are understood to mean that the condition or characteristic is defined to within tolerances that are acceptable for operation of the embodiment for an application for which it is intended.

Figure 1:
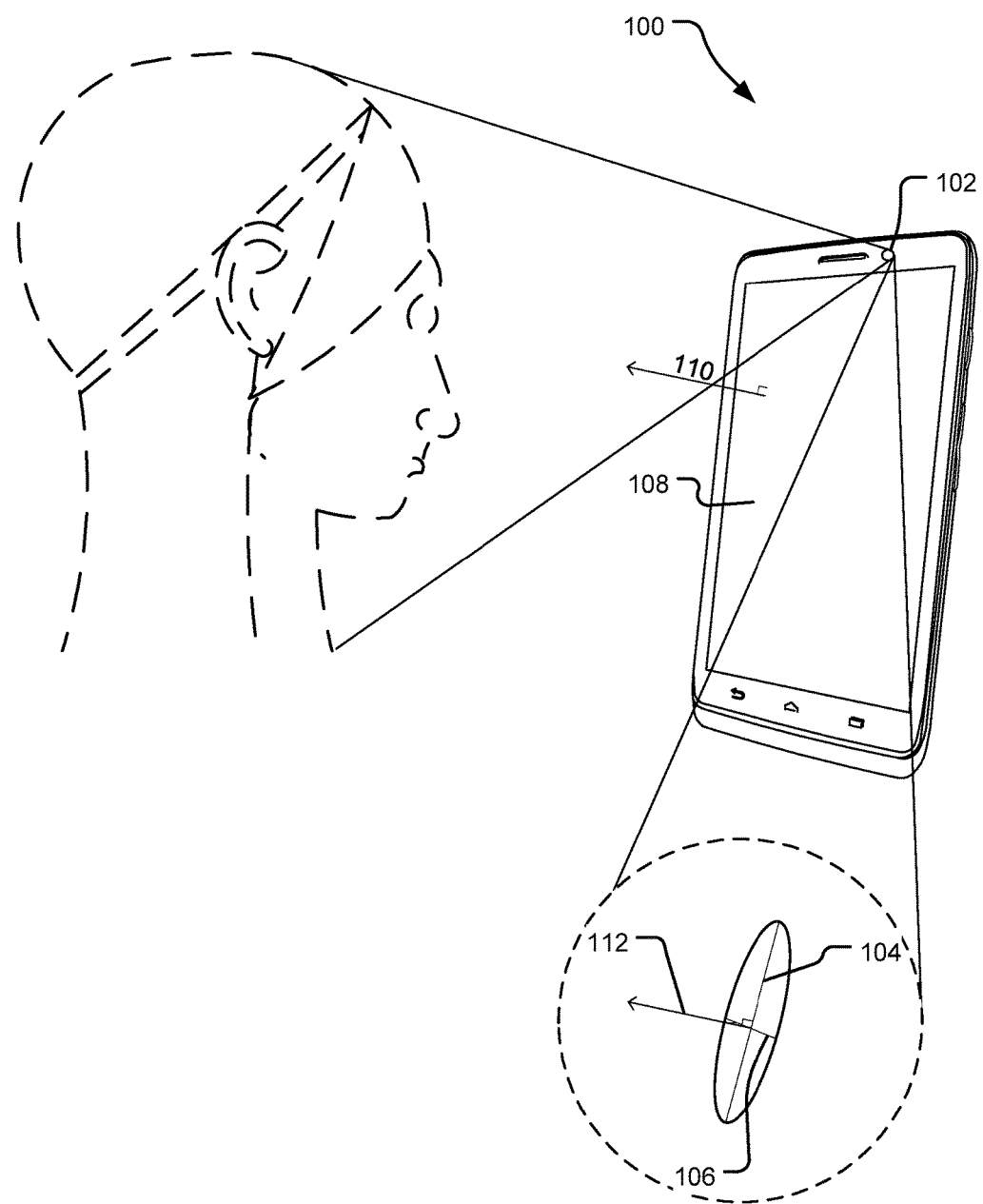
FIG. 1 illustrates an electronic device including an example light projection system providing fast axis expansion for high optical performance.

FIG. 1 illustrates an example electronic device 100 including a light projection system 102 with fast axis expansion for high optical performance. The light projection system 102 includes an edge-emitting semiconductor laser diode (not shown) that projects a light beam into a user environment along an optical projection axis 112. Within the electronic device 100 of FIG. 1, the optical projection axis 112 is generally parallel to a thin axis 110 of the electronic device 100. The electronic device 100 is illustrated to be a cell phone; however, the electronic device 100 may also be any of a number of devices incorporating light projection technologies including without limitation, a tablet computer, a home security system, a computer system, a set-top box, smart watch, etc.

The electronic device 100 includes a processor for executing an operating system and at least one light projection application stored in memory of the electronic device 100 and operable to initiate projection of light and/or to detect and analyze projected light. For example, the light projection application may include one or more programs for depth mapping (e.g., using structured light patterns or time of flight measurements) or biometric assessments such as eye tracking, retina identification, facial recognition, and other feature identification and measurements.

In FIG. 1, the edge-emitting semiconductor laser diode is operable to emit laser light having a fast axis 104 and a slow axis 106 that are each perpendicular to the optical projection axis 112. When emitted from the edge-emitting semiconductor laser diode, laser light expands more rapidly in a direction along the fast axis 104 than a direction along the slow axis 106. The laser light is received by a diffuser (not shown) that diffuses and projects the light through a window in the electronic device and into the user environment. After being diffused by the diffuser, the laser light may no longer exhibit a clear fast and slow axis (e.g., as in the fast axis 104 and the slow axis 106 that exist inside of the electronic device 100).

In some device configurations, an edge-emitting semiconductor laser diode is oriented to emit laser light with a fast axis 104 aligned along a thin axis of the associated electronic device. These configurations impose spacing constraints and complicate placement of optical components (e.g., lenses, mirrors, the diffuser, a window, etc.), which may ultimately reduce optical performance. In contrast to such configurations, the edge-emitting semiconductor laser diode of the electronic device 100 is oriented to emit laser light with a fast axis 104 initially aligned in a direction substantially perpendicular to the thin axis 110 of the electronic device 100. In one implementation, a slow axis 106 of the initially-emitted laser light may be substantially parallel to the thin axis 110. This allows for high optical performance despite the compact design of the electronic device in the direction of the thin axis 110. Due to internal reflection and redirection of the laser light, both the fast axis 104 and the slow axis 106 are substantially parallel to the display screen 108 (as shown) and perpendicular to the thin axis 110 when the light is emitted from the electronic device 100.

As used herein, the terms "substantially parallel" and "substantially perpendicular" each refer to a range of values including 0 and 90 degrees, respectively, that are suitable for achieving fast axis expansion of laser light in a direction that does not correspond to a thin axis of the electronic device 100. For instance, substantially perpendicular may refer to 90 degrees +/−5 degrees or other value suitable for achieving the above-described fast axis expansion. Likewise, substantially parallel may refer to 0 degrees +/−5 degrees or other value suitable for achieving the above-described fast axis expansion.

Figure 2:
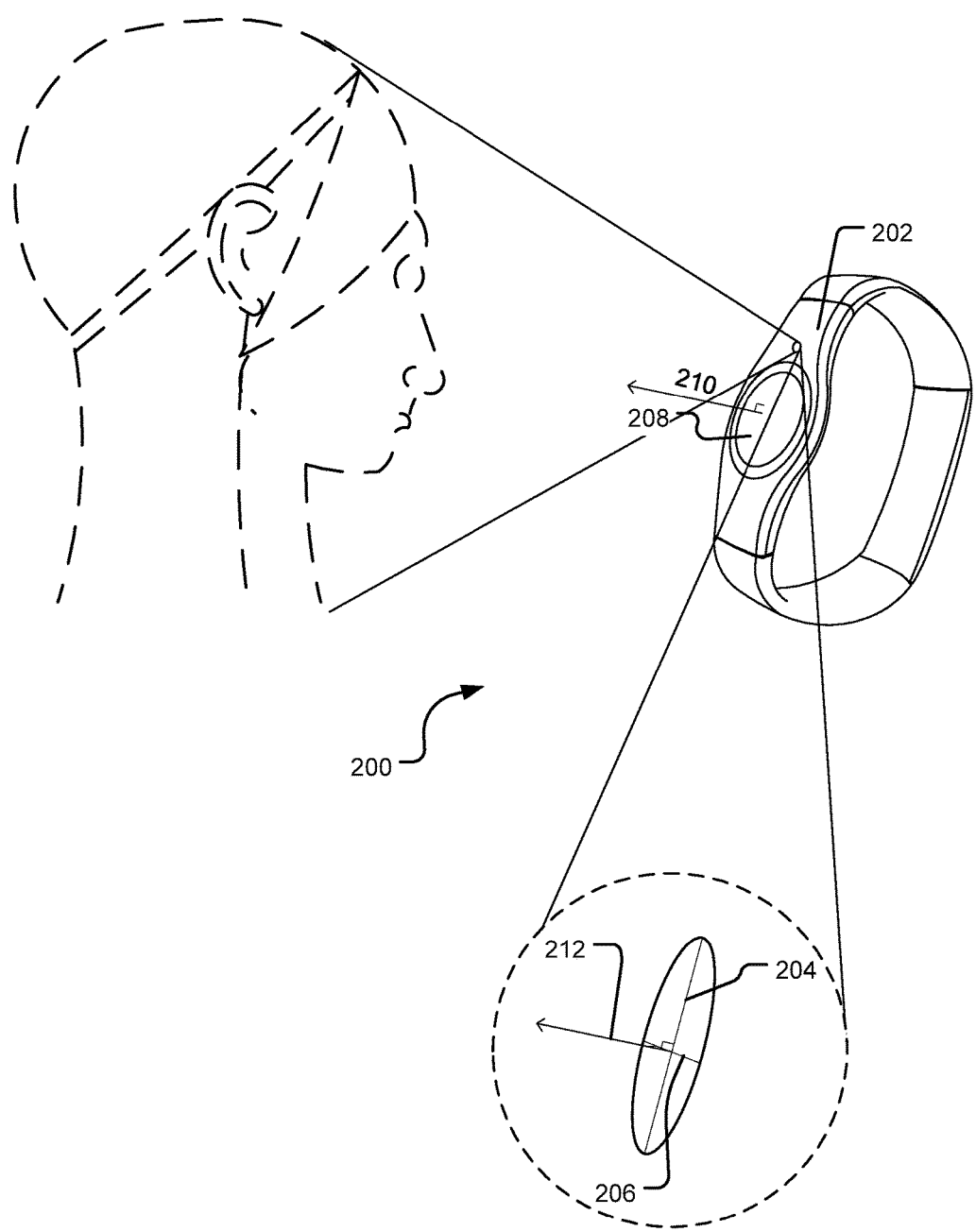
FIG. 2 illustrates an electronic device including another example light projection system providing fast axis expansion for high optical performance.

FIG. 2 illustrates another example electronic device 200 including a light projection system 202 providing fast axis expansion for high optical performance. The light projection system 202 includes an edge-emitting semiconductor laser diode (not shown) that projects a light beam along an optical projection axis 212 within the electronic device 200. The optical projection axis 212 is generally parallel to a thin axis 210 of the electronic device 200.

In FIG. 2, the electronic device 200 is a smart watch including memory, a processor, and at least one light projection application operable to initiate projection of light and/or detect and analyze projected light. The light projection system 202 may further include a diffuser (not shown) for receiving the light beam, redistributing the light beam, and projecting the light beam along the optical projection axis 212 external to the electronic device 200 (e.g., toward a user, as shown).

The edge-emitting semiconductor laser diode has a fast axis 204 and a slow axis 206. In the illustrated implementation, the edge-emitting semiconductor laser diode is oriented within the electronic device 200 so the fast axis 204 of light beam is, at the time that the light beam is initially-emitted, substantially perpendicular to the thin axis 210 of the electronic device 200. In one implementation, the slow axis 206 of the light beam is, at the time the light beam is initially emitted, substantially parallel to the thin axis 210 of the electronic device 200. This allows for high optical performance despite the compact design of the electronic device in the direction of the thin axis 210. Due to internal reflection and redirection of the light beam, both the fast axis 204 and the slow axis 206 are substantially parallel to the display screen 208 (as shown) and perpendicular to the thin axis 210 once the light has been emitted from the electronic device 200.

Figure 3:
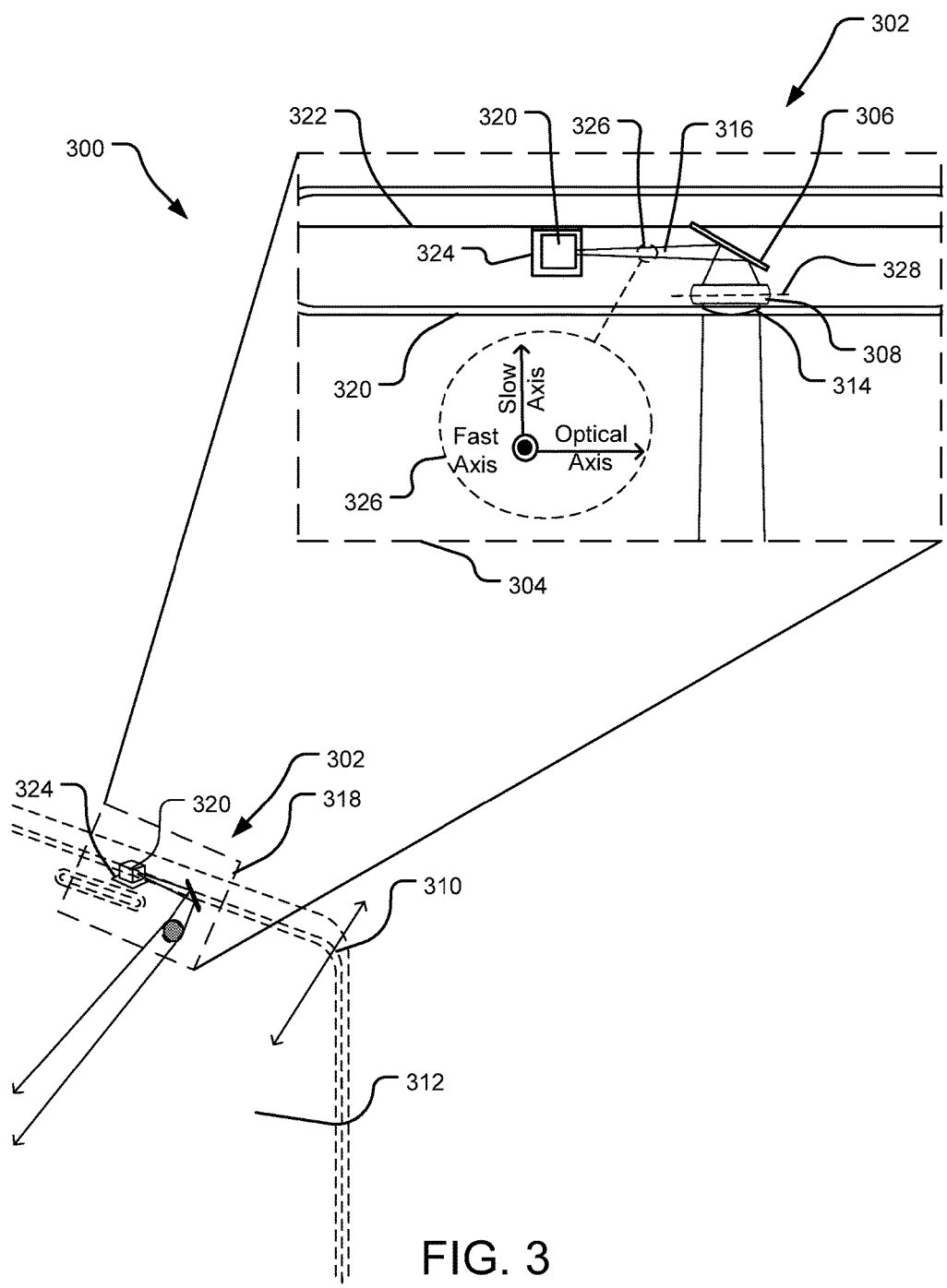
FIG. 3 illustrates a front view and a top-down view of an electronic device including an example light projection system that provides fast axis beam expansion despite thin axis constraints of the electronic device.

FIG. 3 illustrates a front perspective view 318 and a top-down view 304 of an electronic device 300 including a light projection system 302 that provides for fast axis beam expansion despite thin axis constraints of the electronic device 300. The light projection system 302 includes an edge-emitting semiconductor laser diode 320 attached to a submount 324 and further attached to a PCBA 322. The light projection system 302 further includes an optic 306 (e.g., mirror) and a diffuser 308. The edge-emitting semiconductor laser diode 320 is oriented to emit a laser beam 316 toward the optic 306, and the optic 306 is oriented to redirect the laser beam 316 onto a receiving surface of the diffuser 308. After passing through the diffuser 308, the laser beam 316 travels through a window 314 in an outer casing of the electronic device 300 and in a direction substantially perpendicular to a front surface 312 of the electronic device 300 (e.g., in the direction of the thin axis 310).

A mapping key 326 illustrates various axes of the laser beam 316 at the time that the laser beam 316 is initially emitted from the edge-emitting semiconductor laser diode 320. Initially, an optical projection axis of the laser beam 316 (labeled "Optical Axis" in the mapping key 326) is in a direction generally parallel to a PCBA 322. The mapping key 326 further indicates that the optical projection axis is perpendicular to a fast axis and a slow axis of the laser beam 316. When emitted, the fast axis of the laser beam 316 is initially directed into the page of FIG. 3 (e.g., straight down into the electronic device 300) and substantially parallel to the PCBA 322. In contrast, the slow axis of the laser beam 316 is initially directed in the direction of the thin axis 310 of the electronic device 300 (e.g., substantially perpendicular to the PCBA 322).

In FIG. 3, the optic 306 is a reflective surface (e.g., a single-fold mirror) angled to redirect the laser beam 316 toward the diffuser 308. In other implementations, the optic 306 includes a combination of lenses and/or mirrors for redirecting the laser beam 316 onto the diffuser 308. In one implementation, the optic 306 is attached to the PCBA 322 by way of a slot cut into the PCBA 322. Other implementations may utilize other attachment mechanisms. In at least one implementation, the optic 306 is integrated into an electronics package (e.g., enclosure) as the edge-emitting semiconductor laser diode 320. For example, the optic 306 includes one or more prisms or mirrors attached directly to the laser package. In at least one implementation, the optic 306 is directly attached to or integrated as part of the laser package.

The diffuser 308 may be any suitable diffusing device for imaging and redistributing incident light of the laser beam 316. In one implementation, the receiving surface of the diffuser 308 includes a micro-lens array. In another implementation, the diffuser 308 has a rough surface that scatters the light and creates interference between scattered waves.

When the laser beam 316 passes through the diffuser 308, the fast axis of the laser beam 316 remains oriented substantially into the page of the top-down view 304, parallel to a plane 328 of the diffuser 308. This orientation provides ample space for expansion of the laser beam 316 within the electronic device 300 in the fast axis direction before the beam passes through the diffuser 308, resulting in a larger spot size on the diffuser 308 and increased optical performance.

Figure 4:
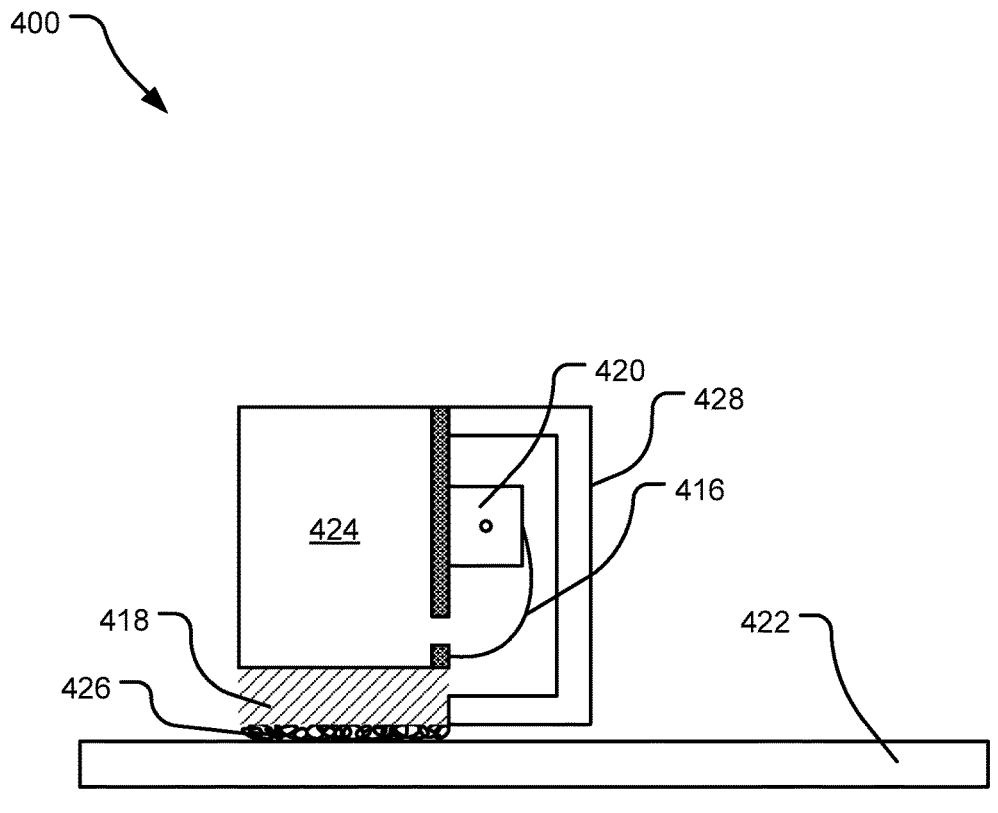
FIG. 4 illustrates a side-perspective view of another example light projection system that provides fast axis beam expansion in a direction substantially parallel to a PCBA.

FIG. 4 illustrates a side-perspective view of an example light projection system 400 that provides fast axis beam expansion in a direction substantially parallel to a PCBA 422. The light projection system 400 includes a submount 424, at least two electrical contacts (e.g., an electrical contact 418), an edge-emitting semiconductor laser diode 420, at least one wire bond 416, and a package lid 428.

A solder bond 426 is formed between the PCBA 422 and the electrical contacts (e.g., the electrical contact 418) of the submount 424 to attach the submount 424 to the PCBA 422. The edge-emitting semiconductor laser diode 420 is affixed to a side portion of the submount 424 and oriented to emit a laser beam in the direction of an optical projection axis generally out of the page (e.g., along a Y-axis, as shown). A fast axis of the laser beam is in a direction substantially parallel to the PCBA 422 (e.g., along the X-axis, as shown), while a slow axis of the laser beam is substantially perpendicular to the PCBA 422 (e.g., along the Z-axis). In some implementations, the light projection system 400 is integrated into an electronic device such that the slow axis (e.g., the Z-axis) of the laser beam is initially aligned with a thin axis of the electronic device.

Figure 5:
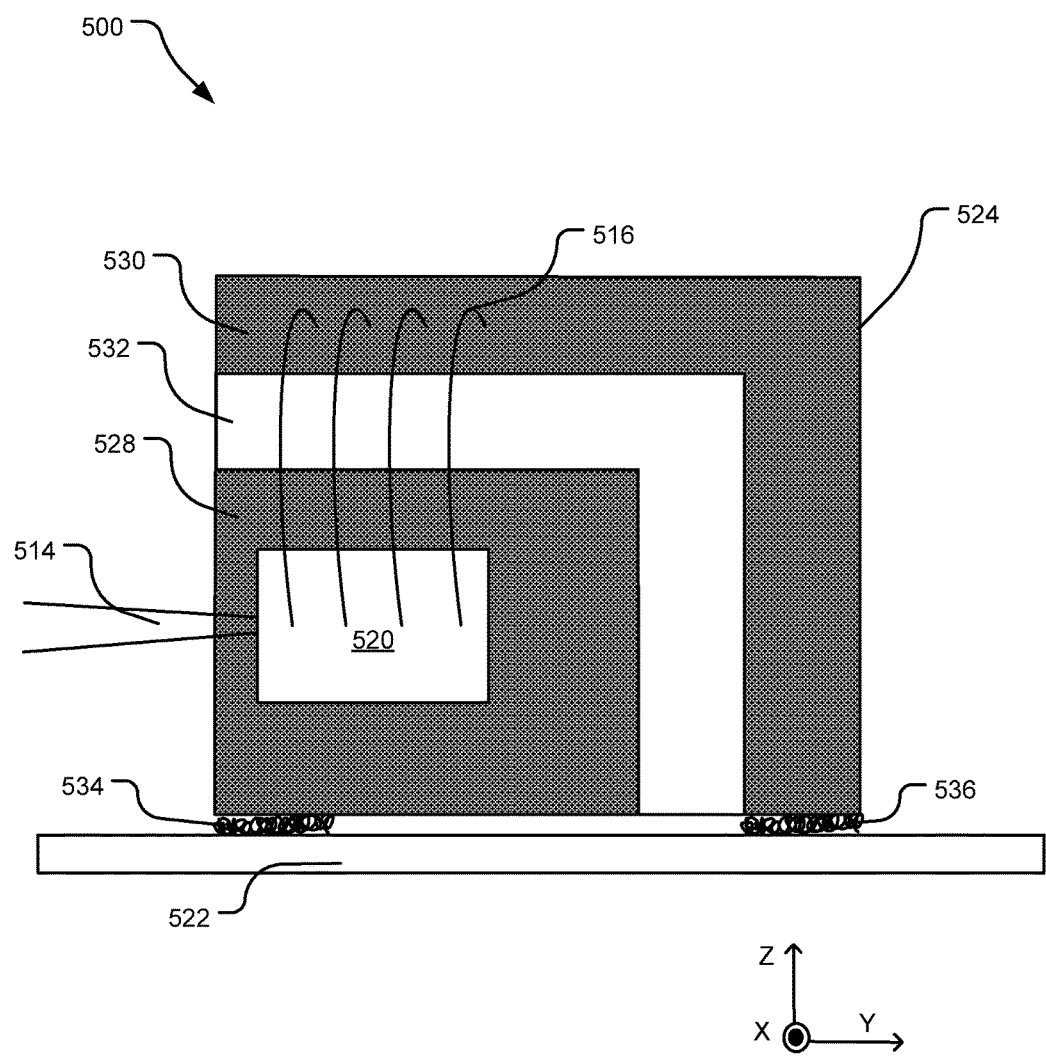
FIG. 5 illustrates a front-perspective view of yet another example light projection system providing fast axis expansion for high optical performance.

The submount 424 includes both conductive and insulating portions, which are shown in greater detail with respect to FIG. 5. In one implementation, insulating portions of the submount 424 have a low thermal expansion coefficient so as to help insulate the edge-emitting semiconductor laser diode 420 from the high operating temperatures of the PCBA 422. The wire bond 416 completes a current loop to and from the PCBA 422 through the different electrical contacts of the submount 424, allowing current to freely flow through between the edge-emitting semiconductor laser diode 420 and the PCBA 422. In one implementation, the submount 424 and semiconductor laser diode 420 are attached directly to the PCBA 422. In an alternative implementation, a submount and semiconductor laser diode are attached to an open cavity QFN (quad-flat no-leads) before being attached to the PCBA, placing an additional layer of interconnect between the submount and the PCBA. In addition, in at least one implementation, fold optics (not shown), such as prisms or mirrors, are directly attached to or integrated as part of the laser package (e.g., the package lid 428).

FIG. 5 illustrates a front-perspective view of an example light projection system 500 providing fast axis expansion for high optical performance. The light projection system 500 includes at least an edge-emitting semiconductor laser diode 520, a submount 524, and a PCBA 522. In one implementation, the light projection system 500 includes the same or similar features to light projection system 400 of FIG. 4 if rotated 90 degrees counterclockwise (e.g., out of the page) about the Z-axis.

The edge-emitting semiconductor laser diode 520 is operable to emit a laser beam 514 with a fast axis and a slow axis, where the fast axis is oriented substantially parallel to a plane of the PCBA 522. For example, the fast axis is in the X-axis direction; the slow axis is in the Z-axis direction; and the laser beam travels away from the light projection system 500 in a direction along the Y-axis (e.g., the negative Y-axis, as shown). When the light projection system 500 is integrated into an electronic device, the submount 524 may be oriented such that the slow axis of the laser beam 514 is generally aligned with a thin axis of the electronic device. In some implementations, the light projection system 500 includes a lid (e.g., the package lid 428 of FIG. 4) that overlays the illustrated electronics.

In some applications, the light projection system 500 is positioned relative to one or more optics to allow for redirection and manipulation of the laser beam after the light beam exits the light projection system 500.

The edge-emitting semiconductor laser diode 520 is mounted or formed on the submount 524 so that at least a portion of the edge-emitting semiconductor laser diode 520 is in contact with a first conductive portion 528 of the submount 524. The submount 524 further includes a second conductive portion 530 separated from the first conductive portion 528 by an insulating material 532. Wire bonds (e.g., a wire bond 516) electrically connect the first conductive portion 528 to the second conductive portion 530, and the first conductive portion 528 and the second conductive portion 530 are also each respectively connected to different electrical contacts on a same surface of the submount 524. These electrical contacts are placed into contact with leads of the PCBA 522 (as shown) via solder bonds 534 and 536. This configuration allows current to freely flow along a loop between the PCBA 522, the first conductive portion 528, the edge-emitting semiconductor laser diode 520, and the second conductive portion 530. In one implementation, the submount 524 and semiconductor laser diode 520 are attached directly to the PCBA 522. In an alternative implementation, a submount and semiconductor laser diode are attached to an open cavity QFN (quad-flat no-leads) before being attached to the PCBA, placing an additional layer of interconnect between the submount and the PCBA.

Figure 6:
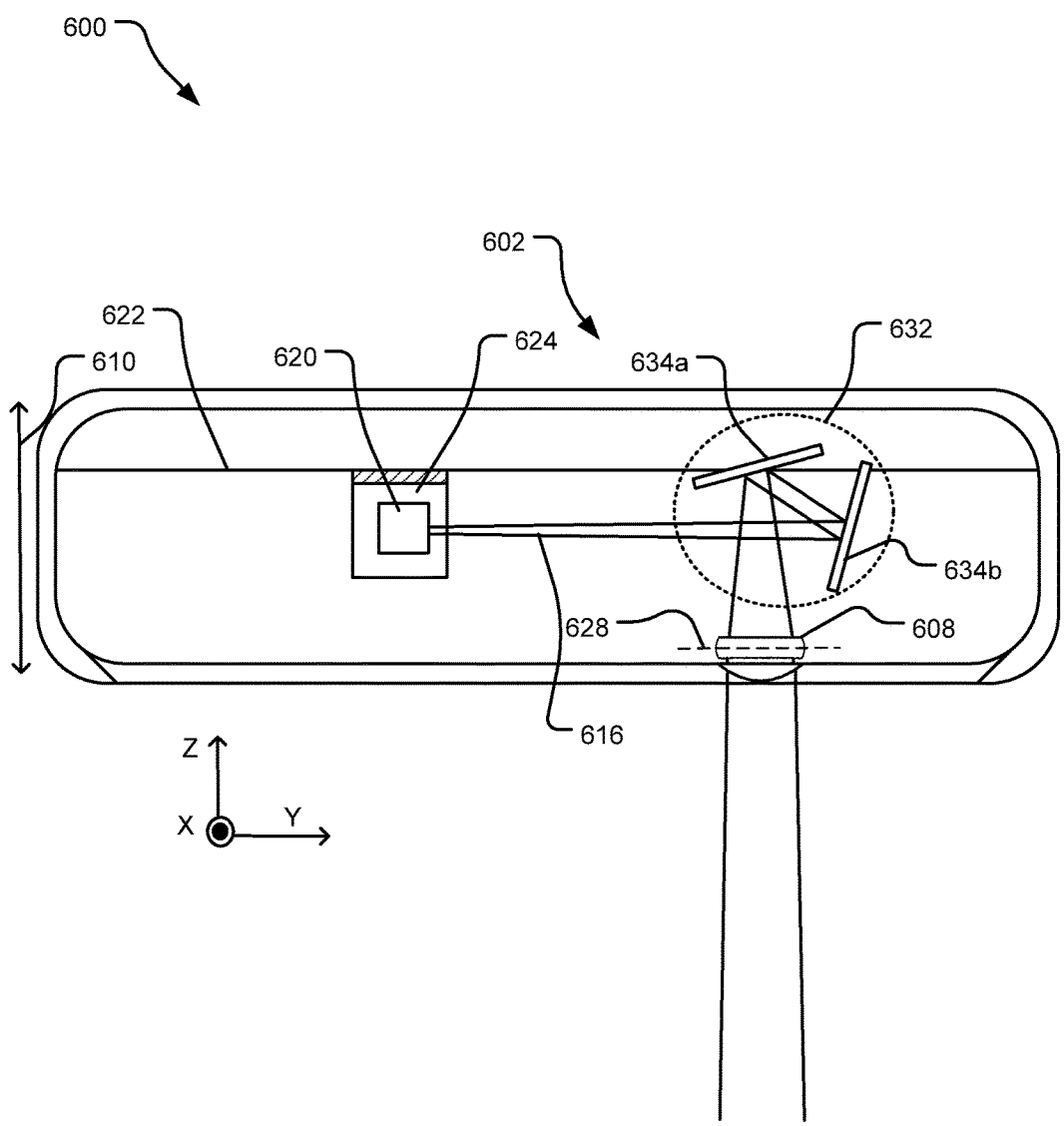
FIG. 6 illustrates another example light projection system that provides fast axis expansion and increased optical path length for high optical performance.

FIG. 6 illustrates a top-down view of another electronic device 600 having an example light projection system 602 that provides fast axis expansion and increased optical path length for high optical performance. Among other components, the light projection system 602 includes an edge-emitting semiconductor laser diode 620 attached to a submount 624, a penta prism 632 including reflective surfaces 634a and 634b (e.g., mirrors), and a diffuser 608.

The submount 624 is affixed to a PCBA 622 at a position and orientation such that the edge-emitting semiconductor laser diode 620 emits a laser beam 616 that travels along an optical projection axis substantially parallel to the PCBA 622, as shown. The emitted laser beam 616 has a fast axis and a slow axis. The fast axis is initially in a direction substantially into the page of FIG. 6, substantially parallel to both a plane 328 of the diffuser 608 and the PCBA 622 (e.g., in the direction of the illustrated X-axis). The slow axis of the laser beam 616 is initially in a direction substantially perpendicular to the PCBA 622 (e.g., in the direction of the illustrated Z-axis). The light projection system 602 is oriented within the electronic device 600 such that a thin axis 610 of the electronic device is substantially aligned with the slow axis of the laser beam 616 (e.g., the Z-axis).

When emitted from the edge-emitted semiconductor laser diode 620, the laser beam 616 is initially directed onto the first reflective surface 634a of the penta prism 632. The first reflective surface 634a reflects the laser beam 616 at an approximate (e.g., +/−5 degrees) 45 degree angle away from the diffuser 608 and onto the second reflective surface 634b of the penta prism 632. The second reflective surface 634b then, in turn, reflects the laser beam 616 at another approximate 45 degree angle, toward the diffuser 608. Redirection of the laser beam 616 via the multiple reflective surfaces of the penta prism 632 effectively extends an optical path of the laser beam 616 between the edge-emitting semiconductor laser diode 620 and the diffuser 608. Lengthening the optical path improves optical performance of the light projection system 602 by allowing the laser beam 616 additional time to expand, increasing an attainable optical spot size incident on the diffuser 608.

The penta prism 632 of FIG. 6 uses two reflective surfaces separated by a cavity (e.g., air, as opposed to a transparent material). In this implementation, the laser beam 616 travels a greater effective optical path length as compared to the implementation of FIG. 7, where a transparent material separates the first reflective surface 634a from the second reflective surface 634b.

In at least one implementation, the penta prism 632 is integrated into an electronics package with the edge-emitting semiconductor laser diode 620 attached to a submount 624. For example, the penta prism 632, semiconductor laser diode 620, and submount 624 may each be attached to same component (e.g., a monolithic component) fixing the position of the first reflective surface 634a and the second reflective surface 634b relative to one another. In at least one implementation, the edge-emitting semiconductor laser diode 620 and submount 624 are encased within an overmolded lead-frame package (not shown).

Figure 7:
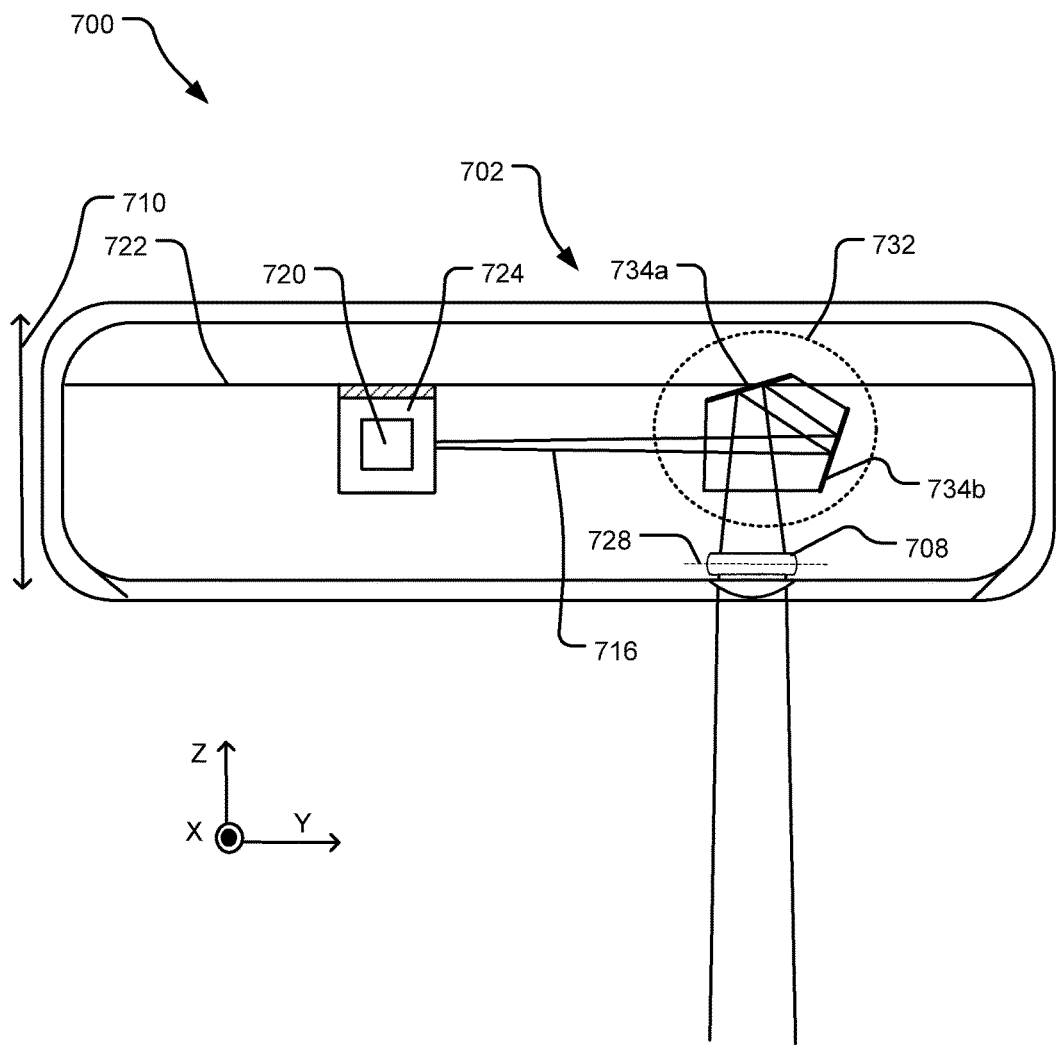
FIG. 7 illustrates still another example light projection system that provides fast axis expansion and increased optical path length for high optical performance.

FIG. 7 illustrates a top-down view of another electronic device 700 including an example light projection system 702 that provides fast axis expansion and increased optical path length for high optical performance. The light projection system 702 includes at least an edge-emitting semiconductor laser diode 720 attached to a submount 724, a penta prism 732, and a diffuser 708. The submount 724 is affixed to a PCBA 722 at a position and orientation such that the edge-emitting semiconductor laser diode 720 emits a laser beam 716 that initially travels in a direction substantially parallel to the PCBA 722 (e.g., along the Y-axis) as shown. The emitted laser beam 716 has a fast axis and a slow axis. The fast axis is initially in a direction substantially into the page of FIG. 7, substantially parallel to both a plane 728 of the diffuser 708 and the PCBA 722 (e.g., in a direction along the illustrated X-axis). The slow axis of the laser beam 716 is initially in a direction substantially perpendicular to the PCBA 722 (e.g., in a direction along the illustrated Z-axis). The light projection system 702 is oriented within the electronic device 700 such that a thin axis 710 of the electronic device is substantially aligned with the slow axis of the laser beam 716 (e.g., in a direction along the Z-axis).

In FIG. 7, the penta prism 732 is a solid component comprising a transparent material between a first reflective surface 734a and a second reflective surface 734b. In another implementation, the penta prism 732 is a monolithic piece of transparent, molded plastic including a reflective coating on the first reflective surface 734a and the second reflective surface 734b. Although the optical path of the laser beam 716 may be smaller in an implementation using the solid penta prism 732 as compared to the penta prism of FIG. 6, the solid penta prism 732 may be easier to manufacture and mass produce.

In at least one implementation, the penta prism 732 is integrated into an electronics package with the edge-emitting semiconductor laser diode 720 attached to a submount 624. For example, the penta prism 732, semiconductor laser diode 720, and submount 724 may each be attached to same component (e.g., a monolithic component) fixing the position of the first reflective surface 734a and the second reflective surface 734b relative to one another.

Figure 8:
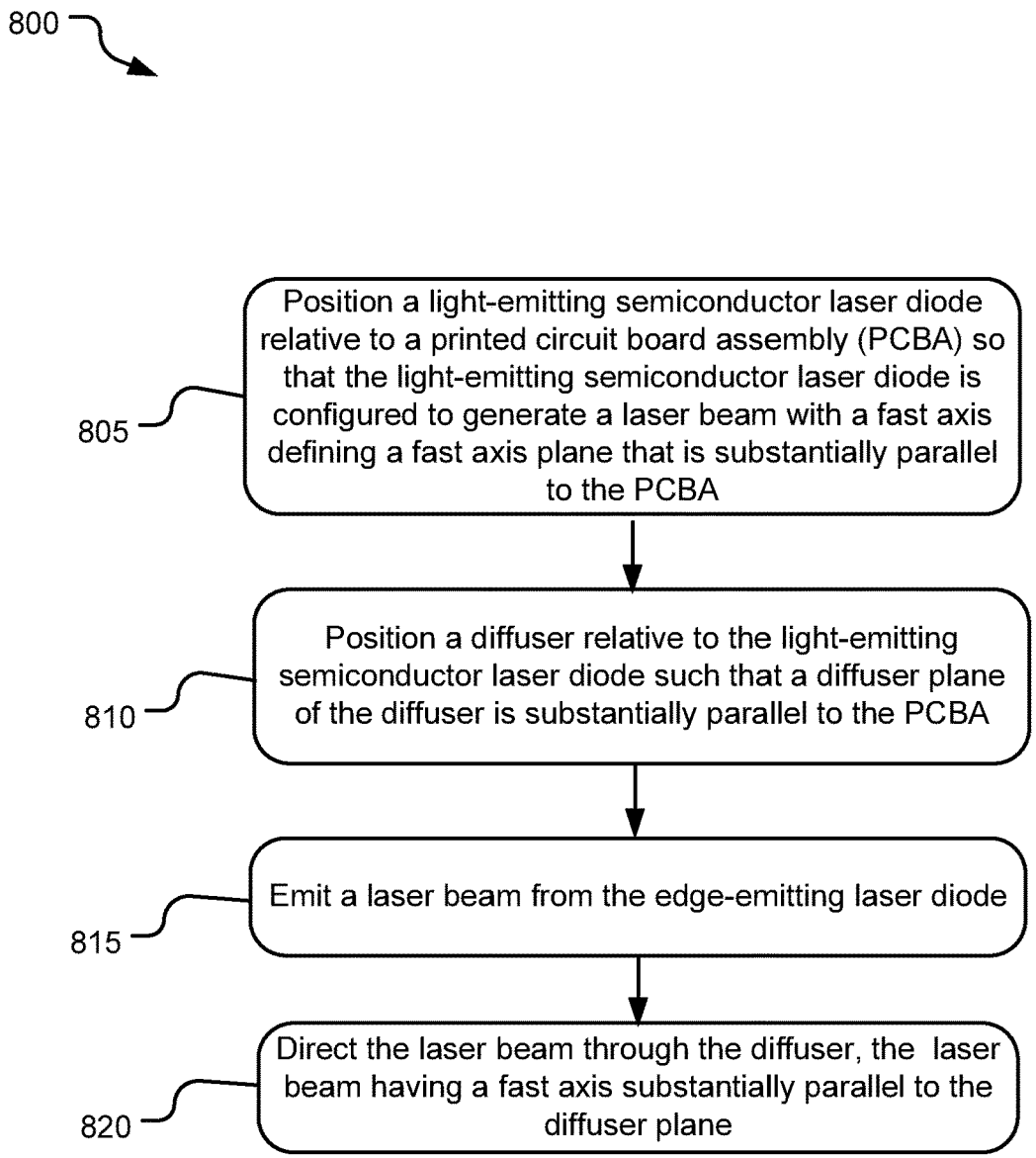
FIG. 8 illustrates example operations for projecting a light beam and achieving a desired minimum spot size on a diffuser plane.

FIG. 8 illustrates example operations 800 for projecting a light beam achieving a desired reduced spot size on a diffuser. A positioning operation 805 positions a light-emitting semiconductor laser diode relative to a PCBA so that the light-emitting semiconductor laser diode is oriented to generate a laser beam having a fast axis defining a fast axis plane that is substantially parallel to the PCBA. Another positioning operation 810 positions the diffuser relative to the light-emitting semiconductor laser diode such that a diffuser plane (e.g., a primary longitudinal plane) of the diffuser is oriented substantially parallel to the PCBA.

An emission operation 815 emits a laser beam from an edge-emitting semiconductor laser diode, and a direction operation 820 directs the laser beam through the diffuser such that the fast axis of the laser beam is parallel to the diffuser plane when the light beam passes through the diffuser. In various implementations, the direction operation 820 entails directing the laser beam to contact one or more optics. For example, the laser beam may be directed onto the diffuser by a single mirror, a penta prism, or any other combination of mirrors and lenses. In implementations including the penta prism, the penta prism may include two mirrors separated by air space or alternatively, solid penta prism including a monolithic component (e.g., filled with a material between reflective surfaces).

Figure 9:
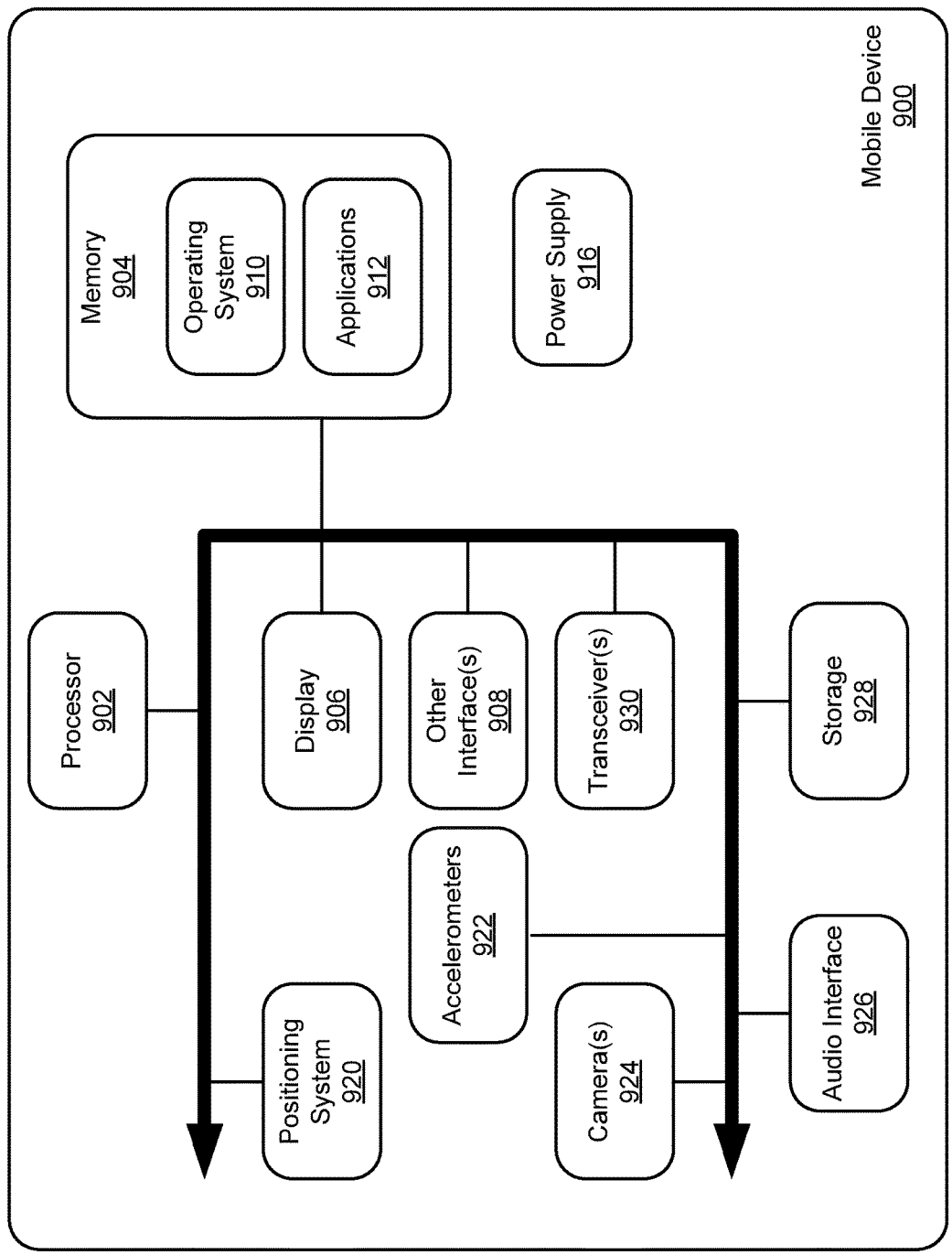
FIG. 9 illustrates another example system that may be useful in implementing the described technology.

FIG. 9 illustrates another example system (labeled as a mobile device 900) that may be useful in implementing the described technology. The mobile device 900 includes a processor 902, a memory 904, a display 906 (e.g., a touch-screen display), and other interfaces 908 (e.g., a keyboard). The memory 904 generally includes both volatile memory (e.g., RAM) and non-volatile memory (e.g., flash memory). An operating system 910, such as the Microsoft Windows® Phone operating system, resides in the memory 904 and is executed by the processor 902, although it should be understood that other operating systems may be employed.

One or more application programs 912 are loaded in the memory 904 and executed on the operating system 910 by the processor 902. Examples of applications 912 include without limitation a rendering engine, a prioritized requestor, a prioritized processor, etc. The mobile device 900 includes a power supply 916, which is powered by one or more batteries or other power sources and which provides power to other components of the mobile device 900. The power supply 916 may also be connected to an external power source that overrides or recharges the built-in batteries or other power sources.

The mobile device 900 includes one or more communication transceivers 930 to provide network connectivity (e.g., mobile phone network, Wi-Fi®, BlueTooth®, etc.). The mobile device 900 also includes various other components, such as a positioning system 920 (e.g., a global positioning satellite transceiver), one or more accelerometers 922, one or more cameras 924, an audio interface 926 (e.g., a microphone, an audio amplifier and speaker and/or audio jack), and additional storage 928. Other configurations may also be employed.

In an example implementation, a light projection application is embodied by instructions stored in memory 904 and/or storage devices 928 and processed by the processing unit 902. Light projection data such as images, TOF measurements, etc. may be stored in memory 904 and/or storage devices 928 as persistent datastores.

The mobile device 900 may be a variety of devices including without limitation a mobile phone, watch, tablet computer, laptop computer, gaming stating, set-top box, workstation, etc. Mobile device 900 may include a variety of tangible computer-readable storage media and intangible computer-readable communication signals. Tangible computer-readable storage can be embodied by any available media that can be accessed by the mobile device 900 and includes both volatile and nonvolatile storage media, removable and non-removable storage media. Tangible computer-readable storage media excludes intangible communications signals and includes volatile and nonvolatile, removable and non-removable storage media implemented in any method or technology for storage of information such as computer-readable instructions, data structures, program modules or other data. Tangible computer-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information and which can accessed by mobile device 900.

In contrast to tangible computer-readable storage media, intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include wired media such as a wired network or direct-wired connection, and wireless media such as acoustic, RF, infrared and other wireless media.

Some embodiments may comprise an article of manufacture. An article of manufacture may comprise a tangible storage medium to store logic. Examples of a storage medium may include one or more types of computer-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. In one embodiment, for example, an article of manufacture may store executable computer program instructions that, when executed by a computer, cause the computer to perform methods and/or operations in accordance with the described embodiments. The executable computer program instructions may include any suitable type of code, such as source code, compiled code, interpreted code, executable code, static code, dynamic code, and the like. The executable computer program instructions may be implemented according to a predefined computer language, manner or syntax, for instructing a computer to perform a certain function. The instructions may be implemented using any suitable high-level, low-level, object-oriented, visual, compiled and/or interpreted programming language.

An example device for projecting laser light includes a diffuser having a diffuser plane, at least a portion of a printed circuit board positioned substantially parallel to the diffuser plane and an edge-emitting semiconductor laser diode configured to emit the laser light having a fast axis and a slow axis. The fast axis of the laser light defines a fast axis plane corresponding to a path the laser light travels from the edge-emitting semiconductor laser diode. A submount on which the edge-emitting semiconductor laser diode is affixed is configured to orient the fast axis plane substantially parallel with the diffuser plane between the diffuser and at least the parallel portion of the printed circuit board.

In another example device of any preceding device, the slow axis of the laser light is substantially perpendicular to the diffuser plane during emission of the laser light from the edge-emitting semiconductor laser diode.

Another example device of any preceding device includes at least one optic to redirect an optical plane of the emitted laser light from a plane substantially parallel to the diffuser to a plane substantially perpendicular to the diffuser.

In another example device of any preceding device, the optical plane is substantially parallel to the printed circuit board at a location where the laser light is initially emitted from the edge-emitting semiconductor laser diode.

Another example device of any preceding device includes a penta prism oriented between the diffuser and the edge-emitting semiconductor laser diode, the penta prism configured to increase an optical path length of the emitted laser light.

In another example device of any preceding device, the penta prism is a solid monolithic component.

In another example device of any preceding device, the penta prism includes two mirrors separated by an air-filled cavity.

In another example device of any preceding device, the light-emitting laser diode is incorporated into an electronic device having a thinnest dimension in a direction defined by a thin axis, and the emitted laser light is emitted from the electronic device along the thin axis.

An example method projects laser light by emitting laser light from an edge-emitting semiconductor laser diode, the laser light having a fast axis and a slow axis. The fast axis of the laser light defines a fast axis plane as the laser light travels from the edge-emitting semiconductor laser diode. The example method further directs the laser light through a diffuser. The diffuser has a diffuser plane that is substantially parallel to the fast axis plane of the laser light received at the diffuser.

Another example method of any preceding method includes directing the laser light onto at least one mirror that redirects the laser light through the diffuser.

In another example method of any preceding method, the fast axis plane of the laser light is parallel to at least a portion of a printed circuit board at a location where the laser light is received at the diffuser.

In another example method of any preceding method, the laser light emitted from the edge-emitting semiconductor laser diode travels in a direction substantially parallel to the printed circuit board.

Another example method of any preceding method includes directing the laser light through a penta prism to increase an optical path length of the laser light before the light is directed through the diffuser, the penta prism oriented between the diffuser and the edge-emitting semiconductor laser diode.

In another example method of any preceding method, the penta prism is a solid monolithic component.

In another example method of any preceding method, the semiconductor laser diode is encased within an overmolded lead-frame package.

An example electronic device is operable to project laser light and includes a device casing having a thinnest physical dimension in a direction defined by a thin axis, a diffuser defining a diffuser plane, at least a portion of a printed circuit board positioned substantially parallel to the diffuser plane, and an edge-emitting semiconductor laser diode configured to emit the laser light having a fast axis and a slow axis. The fast axis of the laser light defines a fast axis plane corresponding to a path the laser light travels from the edge-emitting semiconductor laser diode. A submount on which the edge-emitting semiconductor laser diode is affixed is configured to orient the fast axis plane perpendicular to the thin axis of the device casing and substantially parallel with the diffuser plane between the diffuser and at least the parallel portion of the printed circuit board.

Another example electronic device of any preceding electronic device includes at least one optic to redirect the emitted laser light from a plane substantially parallel to the diffuser to a plane substantially perpendicular to the diffuser.

In another example electronic device of any preceding electron device, the at least one optic includes at least two mirrors.

In another example electronic device of any preceding electron device, the fast axis of the emitted laser light is parallel to a display screen of the electronic device at a location where the laser light is received at the diffuser.

In another example electronic device of any preceding electron device, the optical axis of the laser light is substantially parallel to a display screen of the electronic device at the time the laser light is emitted from the edge-emitting semiconductor laser diode.

An example system includes means for emitting laser light from an edge-emitting semiconductor laser diode, the laser light having a fast axis and a slow axis. The fast axis of the laser light defines a fast axis plane as the laser light travels from the edge-emitting semiconductor laser diode. The example system further includes means for directing the laser light through a diffuser. The diffuser has a diffuser plane that is substantially parallel to the fast axis plane of the laser light received at the diffuser.

Another example system of any preceding system includes means for directing the laser light onto at least one mirror that redirects the laser light through the diffuser.

In another example system of any preceding system, the fast axis plane of the laser light is parallel to at least a portion of a printed circuit board at a location where the laser light is received at the diffuser.

In another example system of any preceding system, the laser light emitted from the edge-emitting semiconductor laser diode travels in a direction substantially parallel to the printed circuit board.

Another example system of any preceding system includes means for directing the laser light through a penta prism to increase an optical path length of the laser light before the light is directed through the diffuser, the penta prism oriented between the diffuser and the edge-emitting semiconductor laser diode.

In another example system of any preceding system, the penta prism is a solid monolithic component.

In another example system of any preceding system, the semiconductor laser diode is encased within an overmolded lead-frame package.

The implementations of the subject matter described herein are implemented as logical steps in one or more computer systems. The logical operations of the present disclosed subject matter are implemented (1) as a sequence of processor-implemented steps executing in one or more computer systems and (2) as interconnected machine or circuit modules within one or more computer systems. The implementation is a matter of choice, dependent on the performance requirements of the computer system implementing the disclosed subject matter. Accordingly, the logical operations making up the embodiments of the disclosed subject matter described herein are referred to variously as operations, steps, objects, or modules. Furthermore, it should be understood that logical operations may be performed in any order, adding and omitting as desired, unless explicitly claimed otherwise or a specific order is inherently necessitated by the claim language.

The above specification, examples, and data provide a complete description of the structure and use of exemplary embodiments. Since many implementations of the invention can be made without departing from the spirit and scope of the invention, the invention resides in the claims hereinafter appended. Furthermore, structural features of the different embodiments may be combined in yet another implementation without departing from the recited claims.

What is claimed is:

1. A device for projecting laser light, the device comprising:
    a diffuser having a diffuser plane, the diffuser plane being a primary longitudinal plane of the diffuser;
    at least a portion of a printed circuit board positioned substantially parallel to the diffuser plane;
    an edge-emitting semiconductor laser diode configured to emit the laser light propagating along an optical axis and having a fast axis and a slow axis each being perpendicular to the optical axis; and
    a submount on which the edge-emitting semiconductor laser diode is affixed and configured to orient the edge-emitting semiconductor such that the fast axis and the optical axis of the emitted light are each substantially parallel to the diffuser plane when propagating between the diffuser and at least the parallel portion of the printed circuit board.

2. The device of claim 1, wherein the slow axis of the laser light is substantially perpendicular to the diffuser plane during emission of the laser light from the edge-emitting semiconductor laser diode.

3. The device of claim 1, further comprising:
    at least one optic to redirect an optical plane of the emitted laser light from a plane substantially parallel to the diffuser to a plane substantially perpendicular to the diffuser.

4. The device of claim 2, wherein the optical plane is substantially parallel to the printed circuit board at a location where the laser light is initially emitted from the edge-emitting semiconductor laser diode.

5. The device of claim 1, further comprising:
a penta prism oriented between the diffuser and the edge-emitting semiconductor laser diode, the penta prism configured to increase an optical path length of the emitted laser light.

6. The device of claim 5, wherein the penta prism is a solid monolithic component.

7. The device of claim 5, wherein the penta prism includes two mirrors separated by an air-filled cavity.

8. The device of claim 1, wherein the light-emitting laser diode is incorporated into an electronic device having a thin axis defined by the thinnest exterior physical dimension of the device, and the emitted laser light is emitted from the electronic device along the thin axis.

9. A method projecting laser light, the method comprising:
emitting the laser light from an edge-emitting semiconductor laser diode, the laser light propagating along an optical axis and having a fast axis and a slow axis, each of the fast axis and the slow axis being perpendicular to the optical axis; and
directing the laser light through a diffuser, the diffuser having a diffuser plane substantially parallel to the fast axis and the optical axis of the laser light received at the diffuser, the diffuser plane being a primary longitudinal plane of the diffuser.

10. The method of claim 9, further comprising:
directing the laser light onto at least one mirror that redirects the laser light through the diffuser.

11. The method of claim 9, wherein the fast axis of the laser light is parallel to at least a portion of a printed circuit board at a location where the laser light is received at the diffuser.

12. The method of claim 9, wherein the laser light emitted from the edge-emitting semiconductor laser diode travels in a direction substantially parallel to the printed circuit board.

13. The method of claim 9, further comprising:
directing the laser light through a penta prism to increase an optical path length of the laser light before the light is directed through the diffuser, the penta prism oriented between the diffuser and the edge-emitting semiconductor laser diode.

14. The method of claim 13, wherein the penta prism is a solid monolithic component.

15. The method of claim 13, wherein the semiconductor laser diode is encased within an overmolded lead-frame package.

16. An electronic device operable to project laser light, the electronic device comprising:
a device casing having a thin axis defined by a thinnest physical dimension of the electronic device;
a diffuser defining a diffuser plane, the diffuser plane being a primary longitudinal plane of the diffuser;
at least a portion of a printed circuit board positioned substantially parallel to the diffuser plane;
an edge-emitting semiconductor laser diode configured to emit the laser light propagating along an optical axis and having a fast axis and a slow axis each being perpendicular to the optical axis; and
a submount on which the edge-emitting semiconductor laser diode is affixed and configured to orient the edge-emitting semiconductor such that the fast axis and the optical axis of the emitted light are each perpendicular to the thin axis of the device casing and substantially parallel with the diffuser plane when propagating between the diffuser and at least the parallel portion of the printed circuit board.

17. The electronic device of claim 16, further comprising:
at least one optic to redirect the emitted laser light from a plane substantially parallel to the diffuser to a plane substantially perpendicular to the diffuser.

18. The electronic device of claim 16, wherein the at least one optic includes at least two mirrors.

19. The electronic device of claim 16, wherein the fast axis of the emitted laser light is parallel to a display screen of the electronic device at a location where the laser light is received at the diffuser.

20. The electronic device of claim 16, wherein an optical axis of the laser light is substantially parallel to a display screen of the electronic device at the time the laser light is emitted from the edge-emitting semiconductor laser diode.

* * * * *